(12) United States Patent
De Winter et al.

(10) Patent No.: US 8,300,212 B2
(45) Date of Patent: Oct. 30, 2012

(54) DEVICE MANUFACTURING METHOD AND LITHOGRAPHIC APPARATUS

(75) Inventors: Laurentius Cornelius De Winter, Vessem (NL); Jozef Maria Finders, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 351 days.

(21) Appl. No.: 12/760,247

(22) Filed: Apr. 14, 2010

(65) Prior Publication Data

US 2010/0265479 A1  Oct. 21, 2010

Related U.S. Application Data

(60) Provisional application No. 61/169,998, filed on Apr. 16, 2009.

(51) Int. Cl.
*G03B 27/54* (2006.01)
*G03B 27/42* (2006.01)
(52) U.S. Cl. .................................. 355/67; 355/53
(58) Field of Classification Search ............ 355/52, 355/53, 67, 71; 359/35; 250/548; 356/399–401
See application file for complete search history.

(56) References Cited

U.S. PATENT DOCUMENTS

| 7,525,640 | B2 | 4/2009 | Jansen et al. |
| 7,961,296 | B2 * | 6/2011 | Finders ........................... 355/67 |
| 2007/0263269 | A1 * | 11/2007 | Flagello ......................... 359/35 |
| 2009/0217233 | A1 * | 8/2009 | Mimotogi et al. .............. 716/21 |
| 2010/0123887 | A1 * | 5/2010 | De Winter et al. ............. 355/55 |

\* cited by examiner

*Primary Examiner* — Hung Henry Nguyen
(74) *Attorney, Agent, or Firm* — Pillsbury Winthrop Shaw Pittman LLP

(57) ABSTRACT

A mask can be used to print a pattern. Due to mask pattern surface topography, an image error may occur, such as an intensity imbalance between adjacent bright lines in the projected pattern. To help alleviate or eliminate the problem of intensity imbalance, the projection system may include an optical phase adjuster constructed and arranged to adjust a phase of an electric field of optical beams of radiation beam traversing the adjuster. A reduction of intensity imbalance is achieved by suitably adjusting the phases of the zeroth, plus first and minus first-order diffracted radiation emanating from the mask pattern. By adjusting the phase differently for different portions of the illumination, the method can be applied such that no decrease of depth of focus due, for example, the $0^{th}$ order is occurring.

18 Claims, 11 Drawing Sheets

DEVICE MANUFACTURING METHOD AND LITHOGRAPHIC APPARATUS

This application claims priority and benefit under 35 U.S.C. §119(e) to U.S. Provisional Patent Application No. 61/169,998, entitled "Device Manufacturing Method and Lithographic Apparatus", filed on Apr. 16, 2009. The content of that application is incorporated herein in its entirety by reference.

FIELD

The present invention relates to a method of manufacturing using a mask and a lithographic apparatus used to print a pattern on a substrate using a mask.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to impart a beam of radiation with a pattern in its cross-section corresponding to a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In optical lithography, an alternating Phase Shift Mask (altPSM) may be used to print, for example, a pattern of lines and spaces. Compared to the use of a conventional Chrome on Glass mask (COG mask) for printing a pattern of lines and spaces, an improved process latitude and a reduced sensitivity to mask CD error may be obtained. The lines of a line-space pattern on an altPSM are typically lines of an absorbing material such as chromium. Neighboring transmissive regions on each side of a line have a same transmittance, but have a different mask thickness. One of the two transmissive regions is modified to have a mask thickness different from (e.g. thinner than) the mask thickness of the other (unmodified) region. The mask thickness difference is chosen such that it corresponds to half a wavelength of illumination radiation as used for the imaging. As a result, two sections of an illumination beam have, upon traversing two respective, neighboring transmissive regions of the mask pattern, a phase difference of 180°. Phase-shifted radiation having traveled through the modified transmissive regions provides an interference with radiation emanating from unmodified transmissive regions of the mask. The interference has the effect of improving a contrast of the image of the pattern of lines and spaces on the substrate. Such a contrast improvement may ultimately increase a lithographic process window.

SUMMARY

An altPSM mask-making process typically includes an etching away of mask substrate material (e.g. quartz) to create the thickness difference between two adjacent transmissive regions. For example, one of the two regions adjacent to a line is etched such that an optical path length difference of $\frac{1}{2}\lambda$, $\lambda$ being the wavelength of the illumination radiation, is provided. Consequently, there exists an inherent topographical asymmetry between the modified and unmodified transmissive regions. Such an asymmetry is known to be a cause of one or more image errors. For example, the image of the line-space pattern may exhibit space width differences and line shifts. Such an image error can at least partly be remedied by incorporating additional (but further complicating) processing steps in the altPSM mask-making process. For example, applying a bias to the space widths of the modified transmissive regions at the mask pattern and/or applying an undercutting of the chromium lines during the etching of the mask substrate (to create the modified regions) may alleviate the occurrence of such an image error. However, any such additional and further complicating processing steps in the altPSM mask-making process render altPSM's a relatively costly type of mask.

It is therefore desirable, for example, to provide a device manufacturing method wherein the need for incorporating additional processing steps in an altPSM mask making process can be alleviated.

According to an aspect, there is provided a device manufacturing method of projecting a mask pattern of an alternating phase shift mask onto a substrate, the method comprising:

illuminating the mask pattern with a beam of radiation to provide a zeroth order diffracted radiation, a first first-order diffracted radiation and a second first-order diffracted radiation emanating from the mask pattern;

imaging the mask pattern onto a substrate using a projection system; and adjusting phase using an optical phase adjuster disposed in the projection system, wherein the zeroth and first-order diffracted radiation traverses the optical phase adjuster, the adjusting including:

adjusting a phase of the zeroth order diffracted radiation to substantially match a phase of the first first-order diffracted radiation, or vice versa, using the phase adjuster, and adjusting a phase of the second first-order diffracted radiation to substantially match the phase of the first first-order diffracted radiation plus 180° using the phase adjuster.

According to an aspect, there is provided a lithographic apparatus including a phase adjuster constructed and arranged to adjust a phase of an electric field of an optical radiation beam traversing a projection system of the lithographic apparatus, and a controller constructed and arranged to apply a spatial phase distribution to an optical wave traversing the phase adjuster, the controller including a computer program containing machine-readable instructions arranged to adjust a phase of zeroth order diffracted radiation to substantially match a phase of first first-order diffracted radiation, or vice versa, using the phase adjuster, and adjust a phase of second first-order diffracted radiation to substantially match the phase of the first first-order diffracted radiation plus 180° using the phase adjuster, wherein a mask pattern is illuminated with a beam of radiation to provide the zeroth order diffracted radiation, the first first-order diffracted radiation and the second first-order diffracted radiation emanating from the mask pattern and the zeroth and first-order diffracted radiation traverse the optical phase adjuster, and the mask pattern is imaged on a substrate using the projection system.

According to an aspect, there is provided a device manufacturing method of projecting a pattern of a patterning device onto a substrate, the method comprising:

emanating a zeroth order diffracted radiation, first first-order diffracted radiation and second first-order diffracted radiation from the pattern of the patterning device;

imaging the pattern onto a substrate using a projection system; and adjusting phase of at least part of the diffracted radiation using an optical phase adjuster, wherein the zeroth and first-order diffracted radiation traverses the optical phase adjuster, the adjusting including:

adjusting phase so that the phase of the zeroth order diffracted radiation substantially matches the phase of the first first-order diffracted radiation, and adjusting phase so that the phase of the second first-order diffracted radiation substantially matches the phase of the first first-order diffracted radiation plus 180°.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
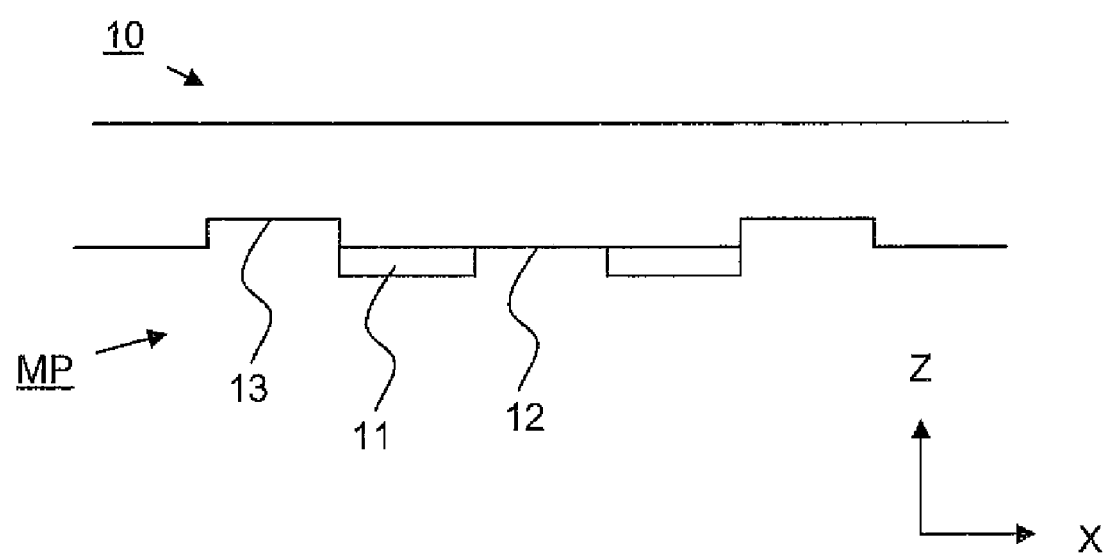
FIG. 1 depicts an alternating Phase Shift Mask (altPSM)

An alternating Phase Shift Mask (altPSM) as used in optical lithography is schematically illustrated in FIG. 1. An altPSM 10 may be provided with a mask pattern MP of lines 11 and spaces 12, 13, separating the lines 11. The lines 11 are typically lines of an absorbing material such as chromium. The spaces at each side of a line 11 are arranged as transmissive regions 12 and 13 and have, along the Z-direction, a different mask thickness. For example, transmissive region 13 may be a modified region having a mask thickness different from (e.g. thinner than) the mask thickness of the other (e.g., unmodified) region 12. The mask thickness difference is chosen such that an optical path length along the Z-direction for radiation traversing the region 12 differs from an optical path length along the Z-direction for radiation traversing the region 13 by substantially half a wavelength of illumination radiation (and an arbitrary number of whole wave lengths of illumination radiation). As a result, two sections of an illumination beam have, upon traversing two respective, neighboring transmissive regions of the mask pattern, a phase difference of 180°. In view of, for example, the thickness difference between two neighboring transmissive areas and the trench-like structure, with side walls extending in the Z-direction, of the modified regions, the mask pattern MP of the altPSM has a three dimensional topography, or in short, a 3D-topography.

Figure 2:
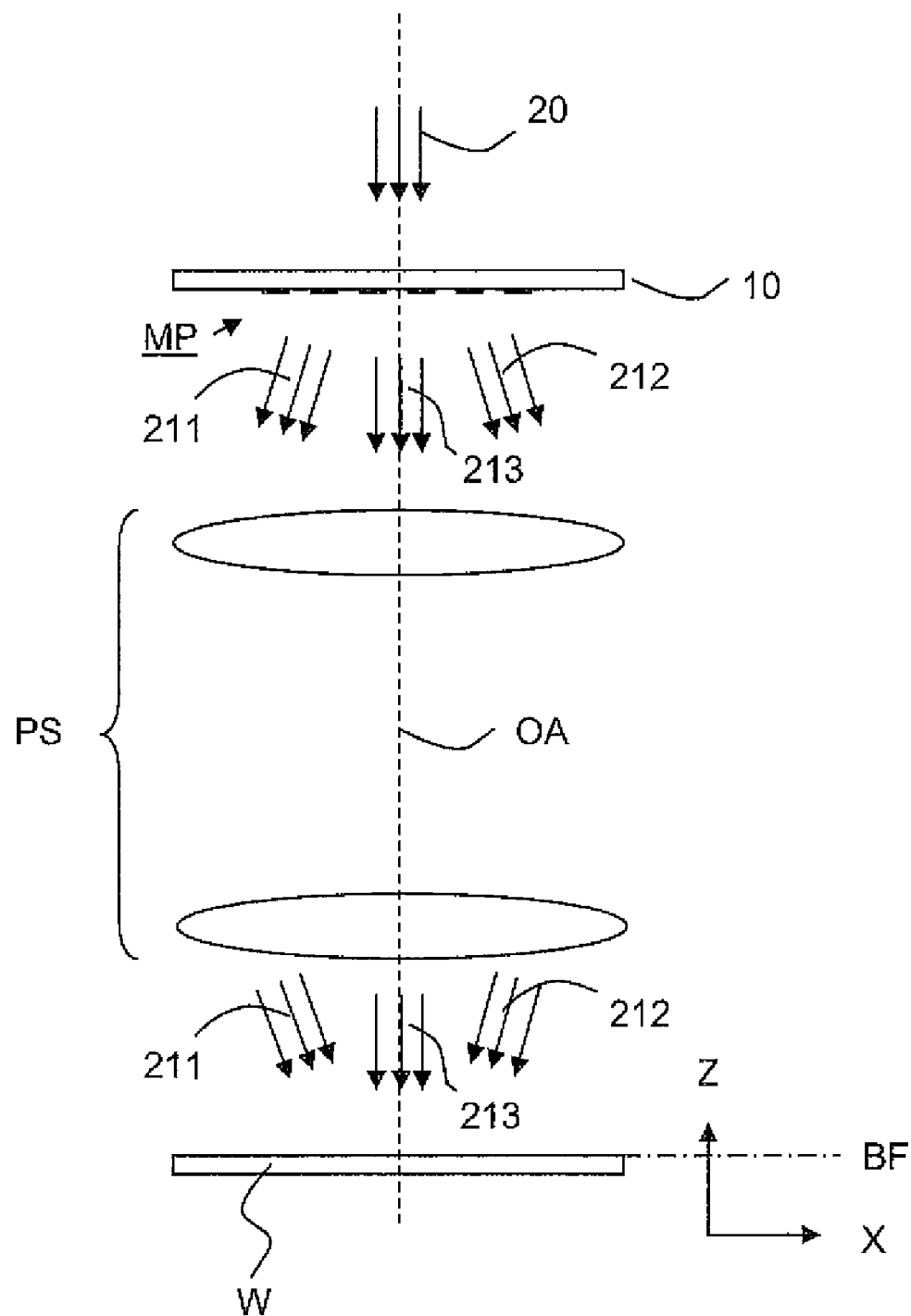
FIG. 2 depicts a use of an altPSM to project an image of a mask pattern on a substrate, using a projection system.

FIG. 2 illustrates a use of the altPSM 10 to project an image of a mask pattern MP on a substrate W, using a projection system PS. A beam of radiation 20 illuminates the altPSM 10, so that zeroth order, plus first-order and minus first-order diffracted radiation is present downstream of the mask 10. The beam 20 is, upon traversing the mask 10, diffracted into two first-order diffracted beams 211 and 212, also referred to herein as the plus and minus first-order diffracted beams, respectively, and a zeroth-order diffracted beam 213. The diffracted beams are captured by the projection system PS. The diffracted beams 211, 212 and 213 traverse the projection system PS and an imaging of the mask pattern is effectuated upon recombination of the beams 211, 212 and 213. The recombination occurs at and near a target portion on a surface of the substrate W. The surface of the substrate W is disposed at a best focus position BF along a Z-axis of the projection system (parallel to an optical axis OA of the projection system PS).

Scattering and/or different boundary conditions of radiation at the side-walls of the spaces 13, see FIG. 1, may contribute to the zeroth order diffracted beam 213. Like the plus and minus first-order diffracted beams 211 and 212, the zeroth order diffracted beam 213 is captured by the projection system PS. It coherently recombines in the image with the other diffracted beams 211 and 212, and hence affects the image. It is to be appreciated that all the diffracted beams 211, 212, and 213 originate from a single same illumination beam 20, so that these diffracted beams are mutually coherent. Therefore, an optical phase of the radiation of one diffracted beam relative to an optical phase of the radiation of another diffracted beam is well defined. Also, optical phases of the respective diffracted beams are well defined with respect to any reference wave front associated with the imaging provided by the diffracted beams. Similarly, an optical phase difference between any two diffracted beams is well defined. In the present text, an optical phase may be referred to as, simply, a "phase" herein. It is assumed to be understood that values of phases of different diffracted beams are given with reference to a reference wave front.

A phase of a diffracted beam can be calculated, for example, using a dedicated simulation software program. Advanced simulation programs can simulate diffraction of an electro-magnetic wave at an altPSM mask pattern having a 3D-topography, and allow determination of both phase and electrical amplitude of the electric field associated with a diffracted beam of radiation. Phases of diffracted beams in a so-called thin-mask approximation of the altPSM mask pattern differ from corresponding phases as obtained when accounting for the 3D-topography in a simulation. For example, in a thin-mask approximation of the altPSM mask pattern phases $\Phi 1$, $\Phi 2$, and $\Phi 3$, of respectively the plus first-order, the minus first-order and the zeroth order beam 211, 212, and 213 are given by $\Phi 1=0°$, $\Phi 2=180°$ and $\Phi 3=0°$. Moreover the amplitude of the zeroth order diffracted beam 213 is 0 in this approximation. The 180° phase difference between the two first-order diffracted beams results in a sharp, dark image of lines 11.

Figure 3:
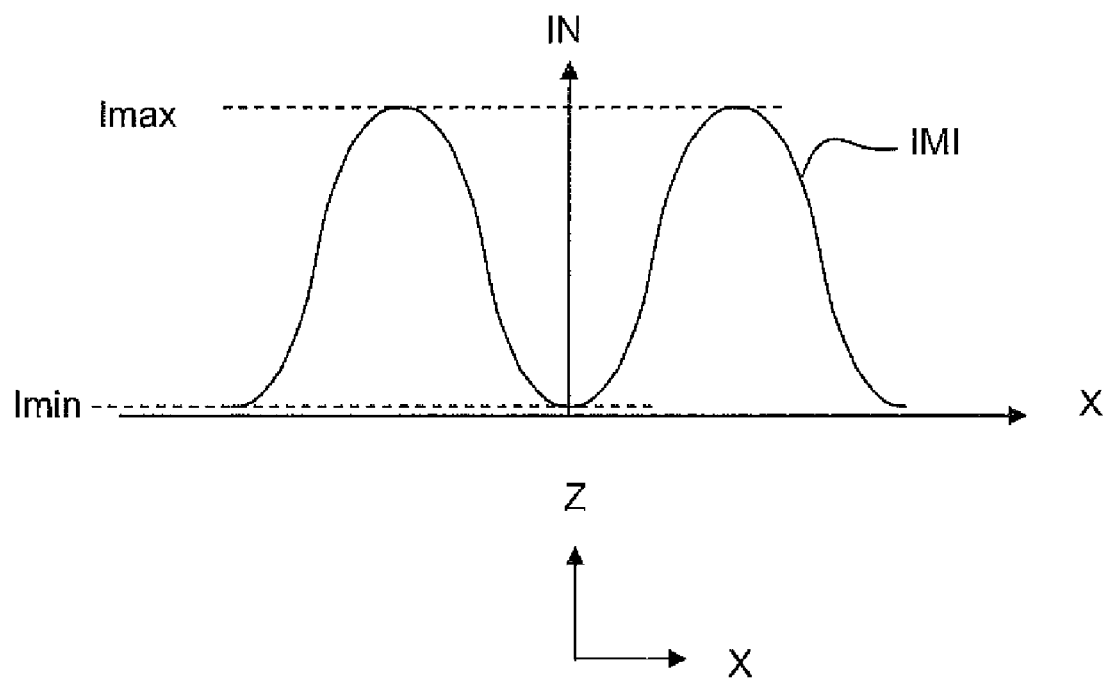
FIG. 3 depicts a plot of an image intensity, where an intensity is plotted along the vertical axis as a function of position along the horizontal axis.
Figure 4:
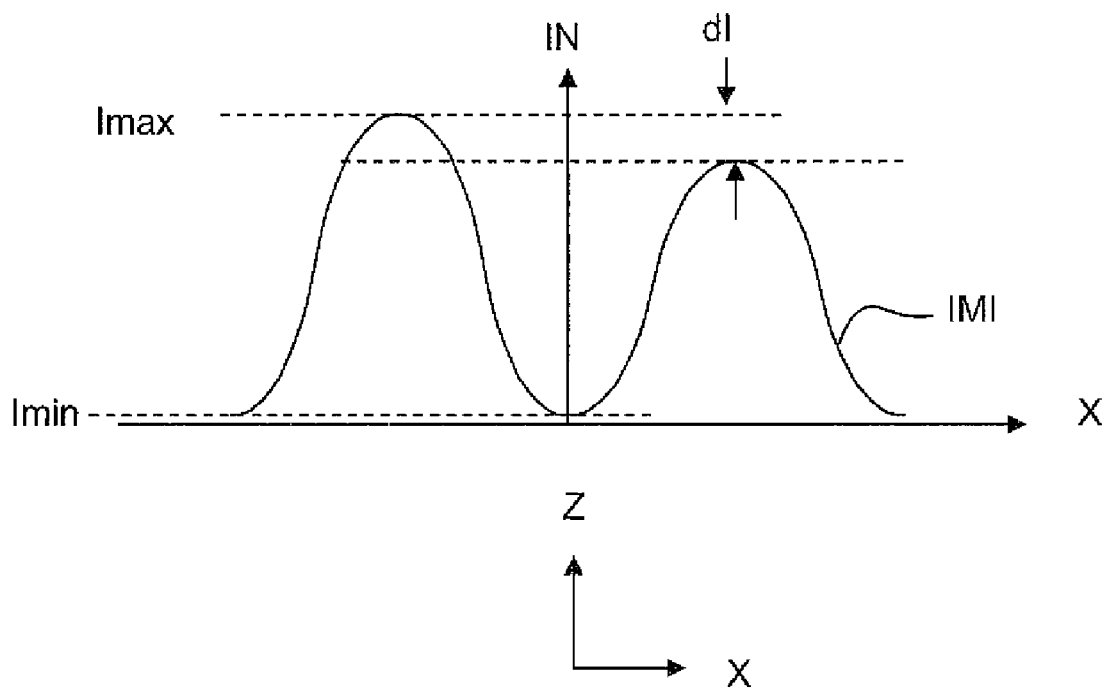
FIG. 4 depicts an intensity imbalance in an image of a line-space mask pattern.

FIG. 3 depicts a plot of an image intensity IMI, where an intensity IN is plotted along the Z-axis as a function of position along the X-axis. The image intensity IMI, i.e., the intensity distribution in the image of the pattern, is modulated in accordance with the line space pattern MP, and the modulation is characterized by a maximum intensity Imax and a minimum intensity Imin. A metric for image quality is contrast C, expressed as C=(Imax−Imin)/(Imax+Imin). The image of a line-space pattern obtained using an altPSM has a relatively high contrast compared to a contrast of an image of a line-space pattern of same pitch, when imaged using a COG mask. However, due to the 3D-topography of the altPSM mask pattern MP, the set of phases $\{\Phi 1, \Phi 2, \Phi 3\}$ in actual use deviates from the set of values $\{0°, 180°, 0°\}$. Moreover the amplitude of the zeroth order diffracted beam 213 is not 0 anymore. Such a deviation, denoted by a set of phase deviations $\{\Delta\Phi 1, \Delta\Phi 2, \Delta\Phi 3\}$, causes an intensity imbalance as schematically shown in FIG. 4, and hence may affect image fidelity. As illustrated in FIG. 4, a maximum intensity corresponding to a space at one side of a line of the mask pattern MP differs from a maximum intensity corresponding to a space at the other side of the line by an amount dI. Another effect of the zeroth order diffracted beam 213 being present is that a quick dephasing takes place in the Z-direction and hence depth of focus is reduced.

A presence of an intensity imbalance dI is inherent to the asymmetry with respect to a line 11 of the 3D-topography of the altPSM mask pattern, as illustrated in FIG. 1. In the presence of intensity imbalance, adjacent spaces print, in developed resist, as trenches with different widths, leading to CD errors of the spaces and to a shift of a line in resist away from a desired position of the line. To alleviate an effect of intensity imbalance, an alt PSM mask pattern may have different additional topographic features, not shown in FIG. 1. The additional topographic features are arranged to reduce an intensity imbalance dI between two spaces adjacent to a line in the image of the mask pattern. Examples of additional topographic features are 1) a biasing of a modified space so as to increase the space width, and an opposite biasing of an unmodified space so as to reduce the space width, 2) an additional reduction of substrate thickness for both the modified and unmodified spaces (an approach to fixing intensity imbalance which is also referred to as the dual trench approach), 3) an isotropic etch resulting in an overhanging chromium profile (an approach to fixing intensity imbalance which is also referred to as the undercut etch approach), 4) a combination of the examples 2 and 3, and in principle any combination of the examples 1-4.

Details about, and effects of, any of these additional topographical features can be gleaned from "Resolution Enhancement Techniques in Optical Lithography", Alfred Kwok-kit Wong, Tutorial Texts in Optical Engineering Volume TT47, SPIE Press, Bellingham, Wash. USA.

According to an embodiment of the invention, a reduction of intensity imbalance can be provided in the absence of one or more of the aforementioned additional topographical features. Consequently, the process steps for making the additional topographic features can be at least partially omitted from the mask making process, which leads to a cost-reduction of the altPSM. Alternatively, an embodiment of the invention provides for a reduction of intensity imbalance in the presence of one or more of the aforementioned additional topographical features. The intensity imbalance may be due, for example, to manufacturing tolerances of the one or more additional topographical features, and consequently, an effect of an embodiment of the present invention is that such manufacturing tolerances can be relaxed. This may lead to a cost-reduction of the altPSM. In both cases, an embodiment of the invention helps to alleviate intensity imbalance as further explained herein.

Further, an intensity imbalance in the presence of an additional topographical feature may be caused by an effect of the additional topographic feature being mask pattern dependent. For example, application of an isotropic etch may lead to an intensity imbalance if the altPSM mask pattern includes features arranged at a first pitch and features arranged at a second pitch different from the first pitch, because the isotropic etch can only be arranged to have optimal effect for imaging features arranged at one pitch.

Figure 5:
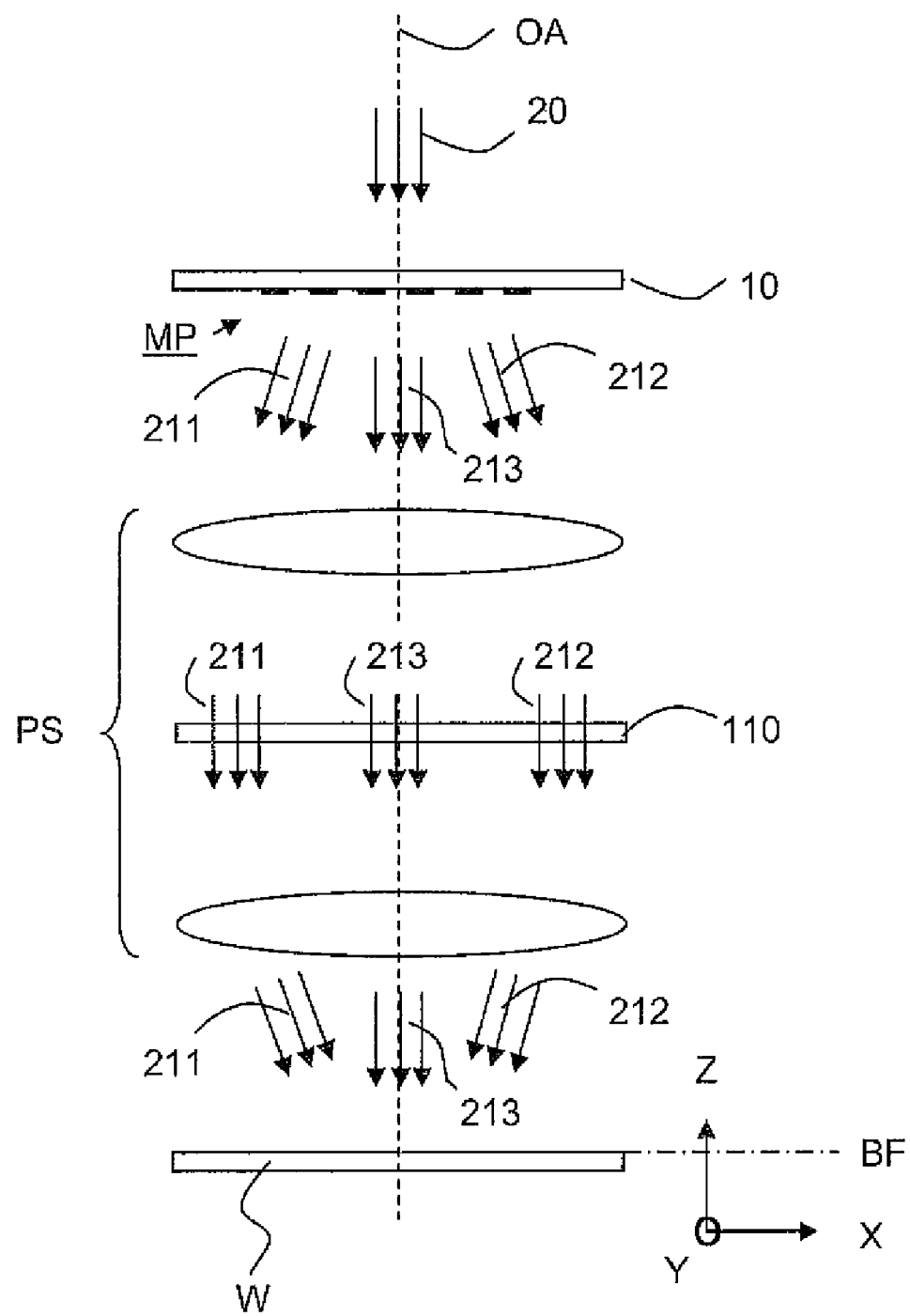
FIG. 5 depicts a projection system provided with an optical phase adjuster to adjust a phase of an electric field of a radiation beam traversing the adjuster.

Referring to FIG. 5, in an embodiment, the mask pattern MP of the altPSM 10 is projected on a substrate W, the projecting including illuminating the mask pattern MP with the beam of radiation 20 to provide the zeroth order diffracted radiation 213, and the plus first-order diffracted radiation 211 and minus first-order diffracted radiation 212 emanating from the mask pattern, and imaging the mask pattern MP on the substrate W using the projection system PS. In the embodiment, the projection system PS is provided with an optical phase adjuster 110 constructed and arranged to adjust a phase of an electric field of optical beams of radiation beam traversing the adjuster, such as the beams 211, 212, and 213, and as schematically indicated in FIG. 5. A reduction of intensity imbalance is achieved by suitably adjusting the phases of the beams 211, 212, and 213, as explained below.

As a first step, one obtains, for example by means of measurement or optical simulation, a first, second and third phase of, respectively the plus first-order, the minus first-order and the zeroth order diffracted radiation beam upstream of the phase adjuster. These phases are denoted respectively by $\Phi 1$, $\Phi 2$, and $\Phi 3$. It is appreciated that these are the phases of the diffracted beams in the absence of any phase adjustment as described below by the phase adjuster 110.

A commercially available computer program can be used to calculate phases, for a given mask pattern data set including data referring to the 3D surface topography. Such a computer program able to account for pattern data in three dimensions is referred to herein as a 3D simulation program.

A next step includes adjusting the second phase $\Phi 2$ to substantially match the first phase $\Phi 1$ plus 180°, and adjusting the third phase $\Phi 3$ to substantially match the first phase $\Phi 1$. Expressed in terms of the phase $\Phi 1$, the resulting set of phases $\{\Phi'1, \Phi'2, \Phi'3\}$ is given by $\{\Phi 1, \Phi 1+180°, \Phi 1\}$, so that with respect to a suitably chosen reference wavefront the set is $\{\Phi'1, \Phi'2, \Phi'3\}=\{0°, 180°, 0°\}$. With a corresponding phase adjustment applied to the phase adjuster 110, the imaging corresponds to the imaging that would have been obtained with an ideal, thin altPSM, which is characterized by an absence of intensity imbalance dI. It is appreciated that an enhancement of depth of focus is desirable as well. A method to achieve such an enhancement is discussed below.

The embodiment may, for example, concern imaging lines embodied as line shaped chromium layers of a thickness between 50 and 150 nm, and having a line width CD of 38 nm. The lines are separated by spaces of 50 nm width, and the imaging includes using an immersion projection lithography apparatus operating at 193 nm radiation wavelength with a setting of the numerical aperture NA at NA=1.35. The line and space widths are the widths desired at substrate level, and a demagnification factor (e.g. a factor 0.25) has to be accounted for when considering corresponding linewidths of the lines and spaces of the mask pattern MP. In the embodiment, the altPSM patterning device 10 is illuminated using a conventional on-axis, and substantially coherent, illumination mode; the angular extent of the illumination beam 20 is usually defined in terms of a fraction σ of the NA of the projection system, and in the embodiment the setting of σ-outer is 0.15 and of σ-inner is zero, where σ-outer and σ-inner refer to an outer and inner radial extent of the angular extent. The illumination radiation as well as the diffracted radiation are linearly polarized along the Y-axis. The altPSM 10 is provided with a line-space pattern having the lines and spaces aligned with the Y direction in FIG. 5.

Using a 3D simulation program, the phases of the diffracted beams 211, 212, and 213 in the presence of this topography are given in Table 1.

TABLE 1

| | Phases of the diffraction orders. | | |
|---|---|---|---|
| | +1st order beam 211 | −1st order beam 212 | 0th order beam 213 |
| Phase Φ [degrees] | −33.54 | (180 − 33.54) = 146.46 | 20.12 |

After the determining the optical phase for each diffracted order, the method proceeds with retrieving a target phase distribution and determining phase changes to be applied to the determined phases. The target phase distribution may be chosen to be {Φ'1, Φ'2, Φ'3}={0°, 180°, 0°}. The set of phases {Φ1, Φ2, Φ3} are stored in a memory device of a controller. A desired setting of the phase adjuster is defined in terms of desired phase changes {dΦ1, dΦ2, dΦ3} which, when applied to the phases {Φ1, Φ2, Φ3} yield phases {Φ1+dΦ1, Φ2+dΦ2, Φ3+dΦ3}. With a desired set of phases being {0°, 180°, 0°}, the desired phase changes {dΦ1, dΦ2, dΦ3} are given by dΦ1=−Φ1, dΦ2=180°−Φ2, and dΦ3=−Φ3. In general, it suffices to apply phase changes {dΦ1, dΦ3} such that {Φ1+dΦ1}−{Φ3+dΦ3}=0, and to apply a phase change dΦ2 such that {Φ2+dΦ2}−{Φ1+dΦ1}=180°. In the latter case, the phases of the zeroth and two first-order diffracted beams resemble the phases in the thin mask approximation, apart from a constant phase. The value of the constant phase, however, does not affect the imaging process or intensity distribution IMI, and therefore is for the imaging essentially irrelevant. Application of phase changes {dΦ1, dΦ2, dΦ3}={33.54°, 33.54°, −20.12°} in the above example leads to a reduction of intensity imbalance in and near a plane of best focus. A maximum phase difference between the adjustments to be provided by the phase adjuster is 33.54−(−20.12)=53.66°, which can correspond to −27.5° phase adjustment of the plus and minus first-order diffracted beams and +27.5° phase adjustment to the zeroth order diffracted beam. As will be appreciated, different adjustments to different orders may be made to arrive at the desired set of phases.

Figure 6:
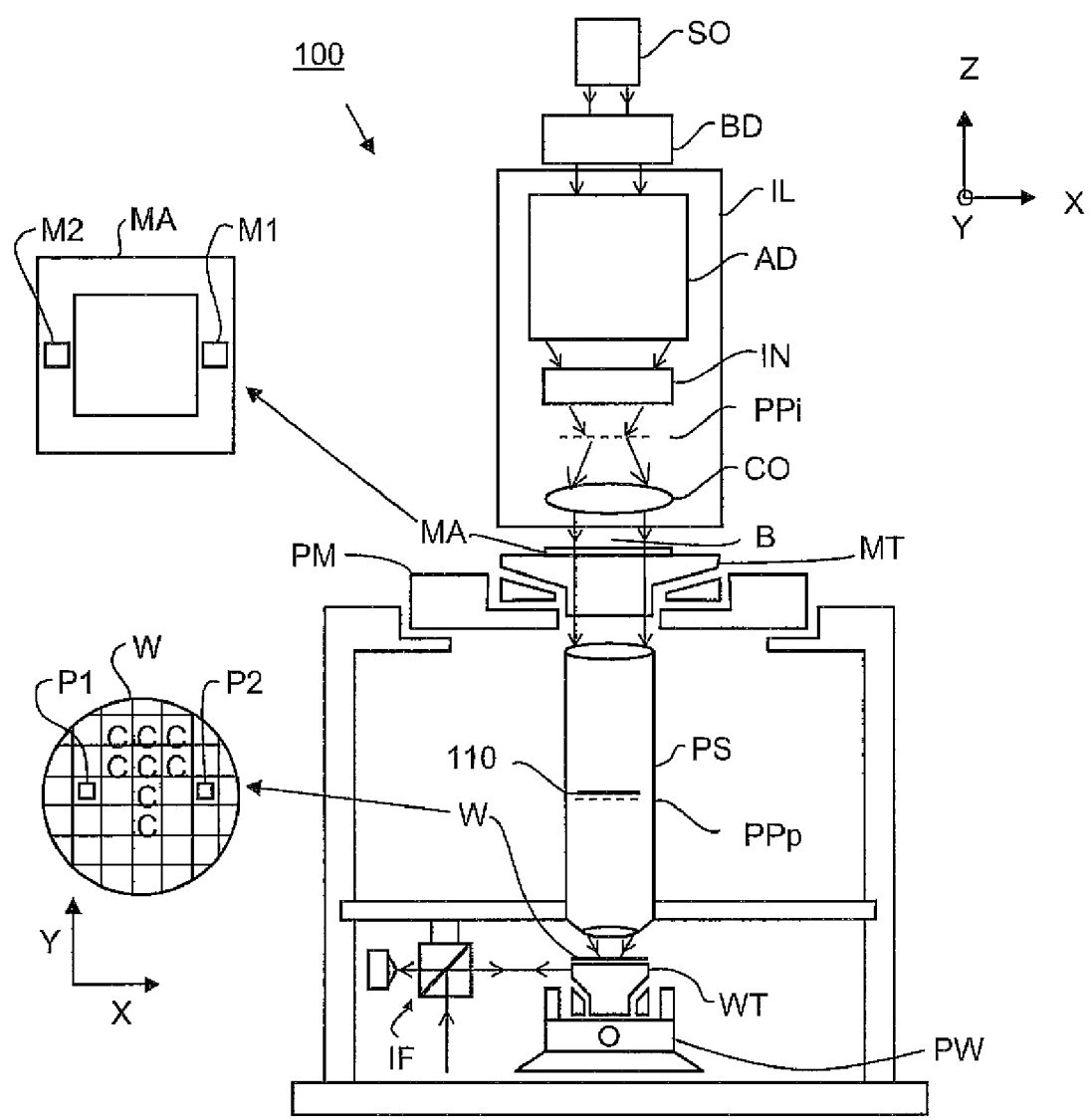
FIG. 6 schematically depicts a lithographic apparatus according to an embodiment of the invention.

As illustrated in FIG. 6, the phase adjuster 110, to which the phase changes {dΦ1, dΦ2, dΦ3}={33.54°, 33.54°, −20.12°} are to be applied, may be disposed near a pupil plane $PP_p$ of the projection system.

FIG. 6 schematically depicts a lithographic apparatus 100 according to an embodiment of the invention. The apparatus 100 comprises:

an illumination system (illuminator) IL configured to condition a radiation beam B (e.g. UV radiation, for example generated by an excimer laser operating at a wavelength of 248 nm or 193 nm, or EUV radiation as generated by a laser-fired plasma source operating at about 13.6 nm wavelength or at wavelengths between 3 and 7 nm);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus 100 is of a transmissive type (e.g. employing a transmissive mask). Alternatively, the apparatus may be of a reflective type (e.g. employing a programmable mirror array of a type as referred to above, or employing a reflective mask).

The projection system PS comprises the phase adjuster 110 constructed and arranged to adjust a phase of an electric field of an optical radiation beam traversing the projection system.

The lithographic apparatus 100 may be of a type having two (dual stage) or more substrate tables (and/or two or more patterning device support structures). In such "multiple stage" machines the additional tables and/or support structures may be used in parallel, or preparatory steps may be carried out on one or more tables and/or support structures while one or more other tables and/or support structures are being used for exposure.

The lithographic apparatus 100 may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus 100, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 6, the illuminator IL receives a radiation beam from a radiation source SO. The source and the lithographic apparatus 100 may be separate entities, for example when the source is an excimer laser. In such cases, the source is not considered to form part of the lithographic apparatus 100 and the radiation beam is passed from the source SO to the illuminator IL with the aid of a beam delivery system BD comprising, for example, suitable directing mirrors and/or a beam expander. In other cases the source may be an integral part of the lithographic apparatus 100, for example when the source is a mercury lamp. The source SO and the illuminator IL, together with the beam delivery system BD if required, may be referred to as a radiation system.

The illuminator IL may comprise an adjuster AD to adjust the angular intensity distribution of the radiation beam. Generally, at least the outer and/or inner radial extent (commonly referred to as σ-outer and σ-inner, respectively) of the intensity distribution in a pupil plane $PP_i$ of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device in accordance with a pattern (e.g. a mask pattern) MP. Having traversed the patterning device MA, the radiation beam B passes through the projection system PS, which focuses the beam onto a target portion C of the substrate W.

The optical arrangement of the apparatus of FIG. 6 uses Koehler illumination. With Koehler illumination, a pupil plane $PP_i$ in the illumination system IL is conjugate to a pupil plane $PP_p$ of the projection system PS. The pupil plane $PP_p$ is a Fourier transform plane of the object plane in which the patterning device MA is located. As is conventional, an illumination mode of this apparatus can be described by reference to the distribution of intensity of the radiation of the beam B in the pupil plane $PP_i$ of the illumination system. The distribution of intensity in the pupil plane $PP_p$ of the projection system PS may be substantially the same as the distribution of intensity in the pupil plane $PP_i$ of the illumination system, subject to diffraction effects of the pattern of the patterning device MA. However, the intensity distribution in the pupil plane $PP_p$ may, depending on diffraction effects of the pattern, substantially differ from the distribution of intensity in the pupil plane $PP_i$ of the illumination system when, for example, an altPSM is used in conjunction with on-axis, coherent illumination to image a line-space pattern. The phase adjuster 110 constructed and arranged to adjust a phase of an electric field of an optical radiation beam traversing the projection system may be disposed at or near the pupil plane $PP_p$ of the projection system. A phase adjustment imparted to an optical wave associated with radiation emanating from a point like area on the mask (and which may include diffracted as well as undiffracted radiation) is substantially independent of an X,Y position of the point-like area when the optical phase adjuster is disposed at or near the pupil plane $PP_p$, since X,Y positions of intersection points of rays of radiation associated with the optical wave with a pupil plane (such as the pupil plane $PP_p$) are substantially independent of the X,Y position of the point-like area.

With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 6) can be used to accurately position the patterning device MA with respect to the path of the radiation beam B, e.g. after mechanical retrieval from a mask library, or during a scan. In general, movement of the patterning device support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus 100 could be used in at least one of the following modes:

1. In step mode, the patterning device support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support structure MT and the substrate table WT are scanned synchronously while a pattern imparted to the radiation beam is projected onto a target portion C (i.e. a single dynamic exposure). The velocity and direction of the substrate table WT relative to the patterning device support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 7:
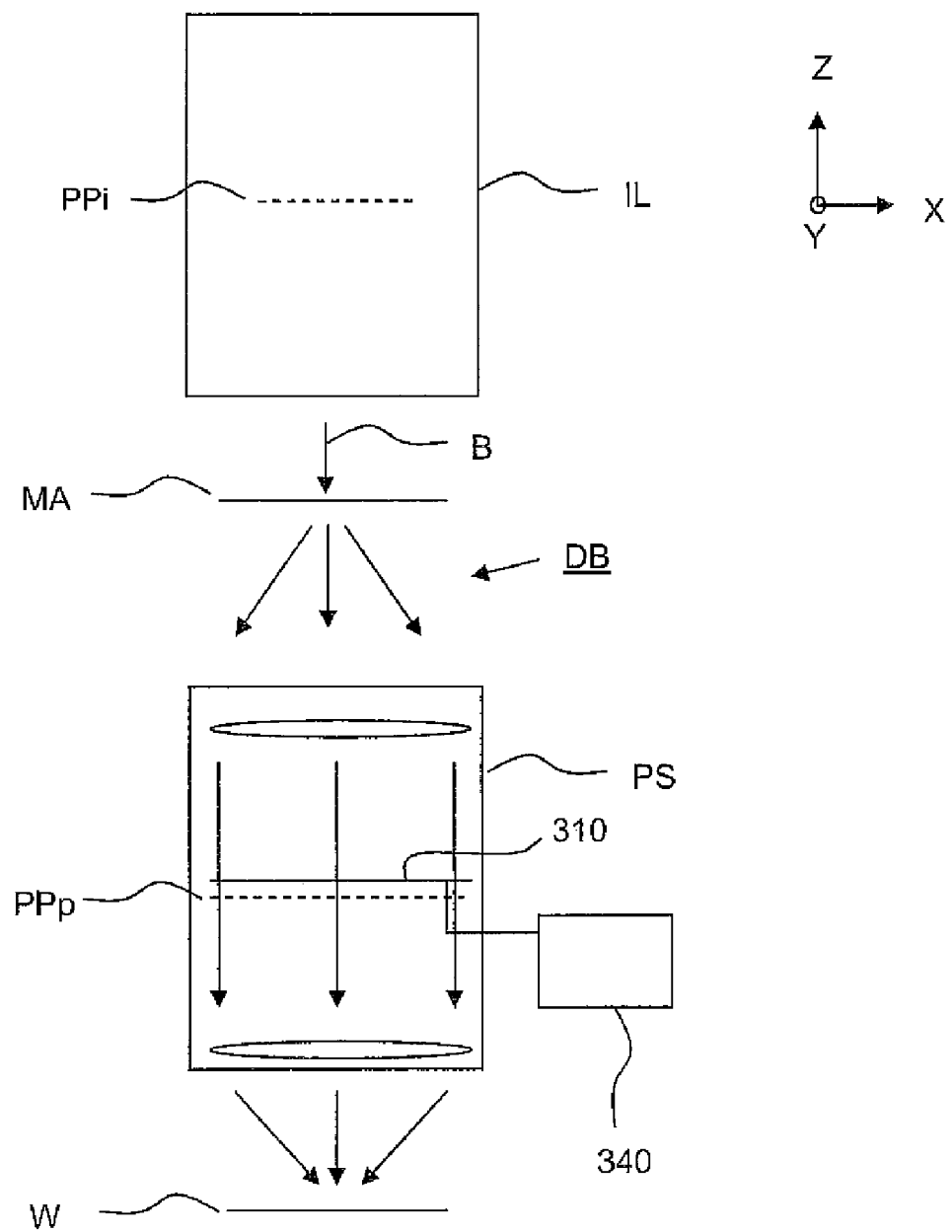
FIG. 7 schematically shows optical elements of the optical phase adjuster.

As schematically shown in FIG. 7, the optical phase adjuster 110 may comprise an optical element 310 of a material substantially transmissive for radiation of the beam B. In an embodiment, the optical element 310 may be reflective for radiation of the beam B. The phase adjuster 110 may further comprise a controller 340. An optical path length for a wave traversing the element 310 is adjustable in response to a signal supplied by controller 340. The optical element 310 may be disposed or disposable, for example, substantially in a Fourier Transform plane such as the pupil $PP_p$, and such that—in use—it is traversed by diffracted beams DB emanating from the patterning device.

Figure 8:
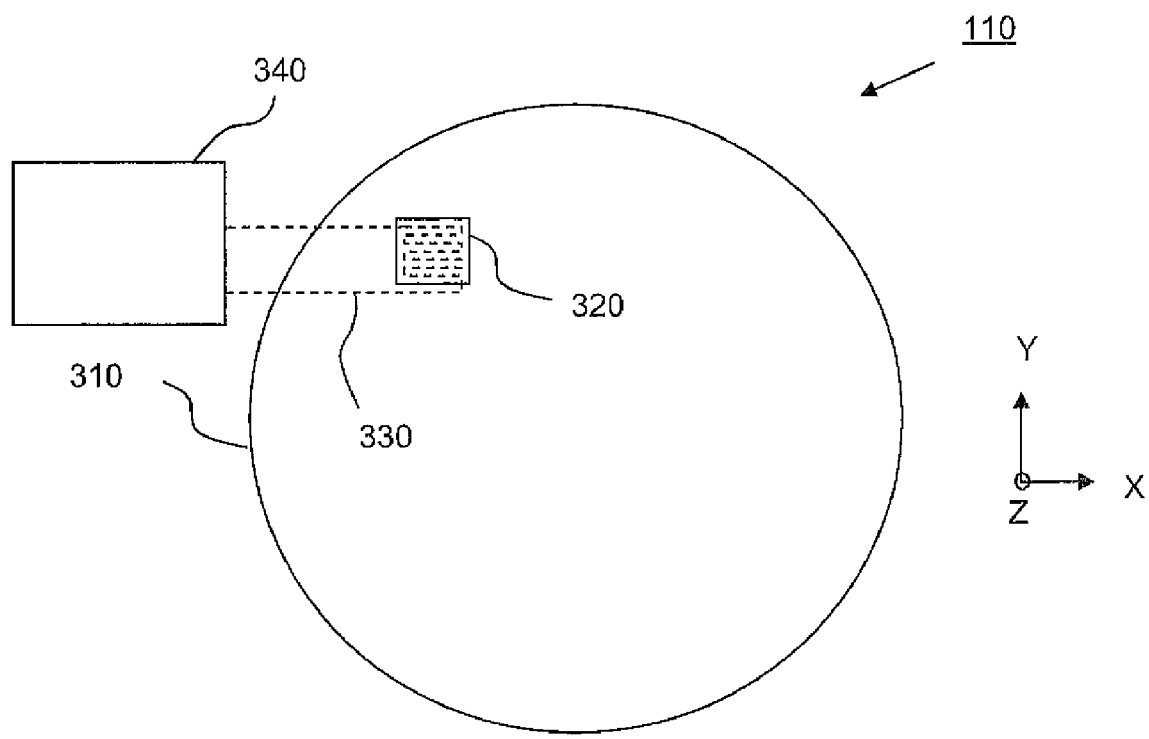
FIG. 8 depicts a detailed top view of the optical phase adjuster.

FIG. 8 illustrates the optical phase adjuster 110 in more detail, and shows a top view, along the Z-axis, of the optical element 310. An adjustment of a phase of an optical wave traversing the element 310 may be obtained by applying heat to, or removing heat from, a portion 320 of the optical element 310, thereby introducing a local change of index of refraction of the material of the element relative to the refractive index of the material adjacent to the portion 320. The application of heat can be realized by, for example, transmitting an electrical current through a wire 330 having Ohmic resistance and being arranged in contact with the portion 320 of the element and with the controller 340 arranged to provide the current to the wire 330.

Figure 9:
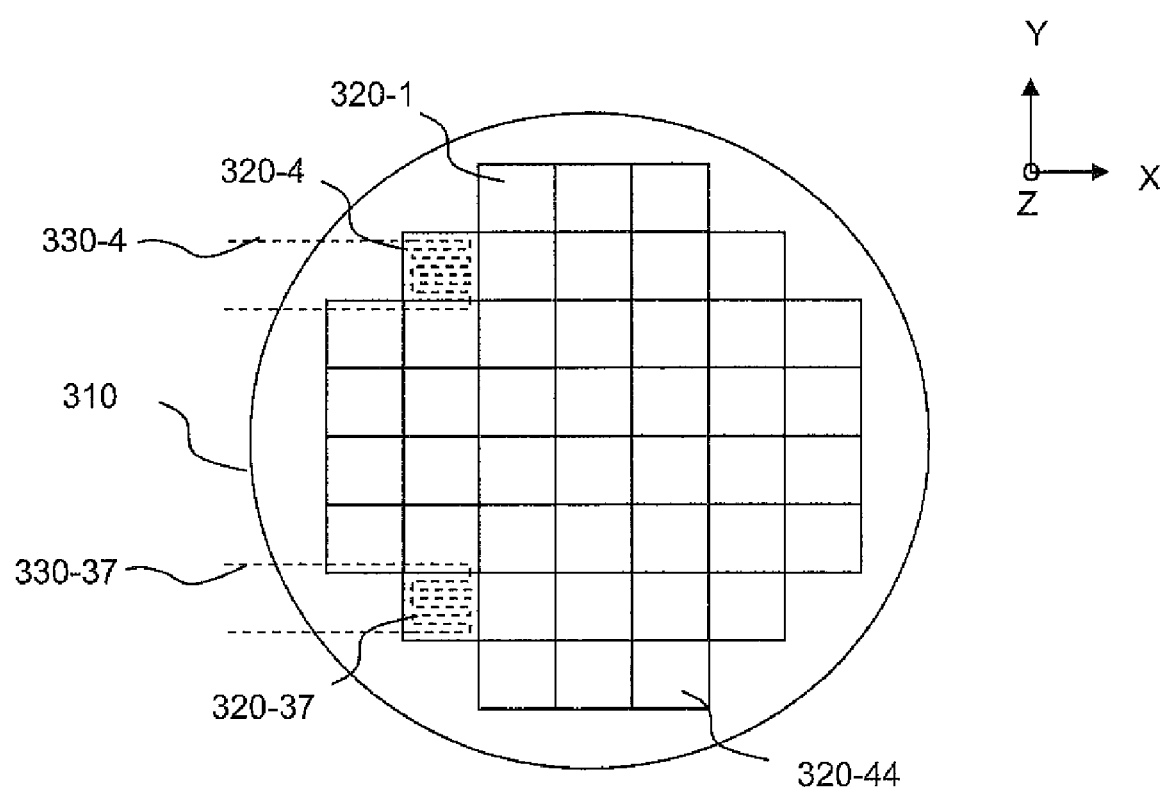
FIG. 9 depicts adjacent portions of the optical phase adjuster having heating wires.

A plurality of adjacent portions of the optical element may be provided with a corresponding plurality of wires for heating any portion independently from any other portion. For example, as schematically illustrated in FIG. 9, adjacent portions 320-1 up to 320-44 are disposed in adjacent rows and numbered from left to right and from top to bottom. Each portion 320 of the portions 320-1 up to 320-44 is provided with correspondingly numbered heating wires 330-1 up to 330-44 (although FIG. 9, merely for clarity sake, illustrates this only for the portions 320-4 and 320-37). The controller 340 is constructed and arranged such that each wire can be current-activated independently. This enables application of a spatial phase distribution to an optical wave traversing the element 310, in accordance with a spatial distribution of the temperature over the element 310 in the X,Y plane.

In addition or alternatively, the optical element 310 may include a channel arranged to contain a cooling or heating fluid. The phase adjuster 110 may include a cooling or heating fluid supply and retrieval system connected to the channel and arranged to circulate cooling or heating fluid at a controlled temperature through the channel. Like the wires 330, a channel may be associated with each portion 320. For example, a cooling of the element 310 in combination with heating a portion 320 of the element 310 may enable adjusting the temperature of the portion 320 within a range of temperatures extending both below and/or above a nominal temperature. The nominal temperature may, for example, be a specified desired operating temperature of the apparatus 100 or of the material of the optical elements of the projection system PS.

Embodiments of a phase adjuster 110 can be gleaned from U.S. Pat. No. 7,525,640. A total number of portions 320 is not limited to 44. Instead it may in general depend on a desired spatial resolution of the temperature distribution. For example, a ratio of the area of each of the portions 320 to the size of a clear area in the pupil plane $PP_p$ of the projection system PS may be between 100 and 1000.

Figure 10:
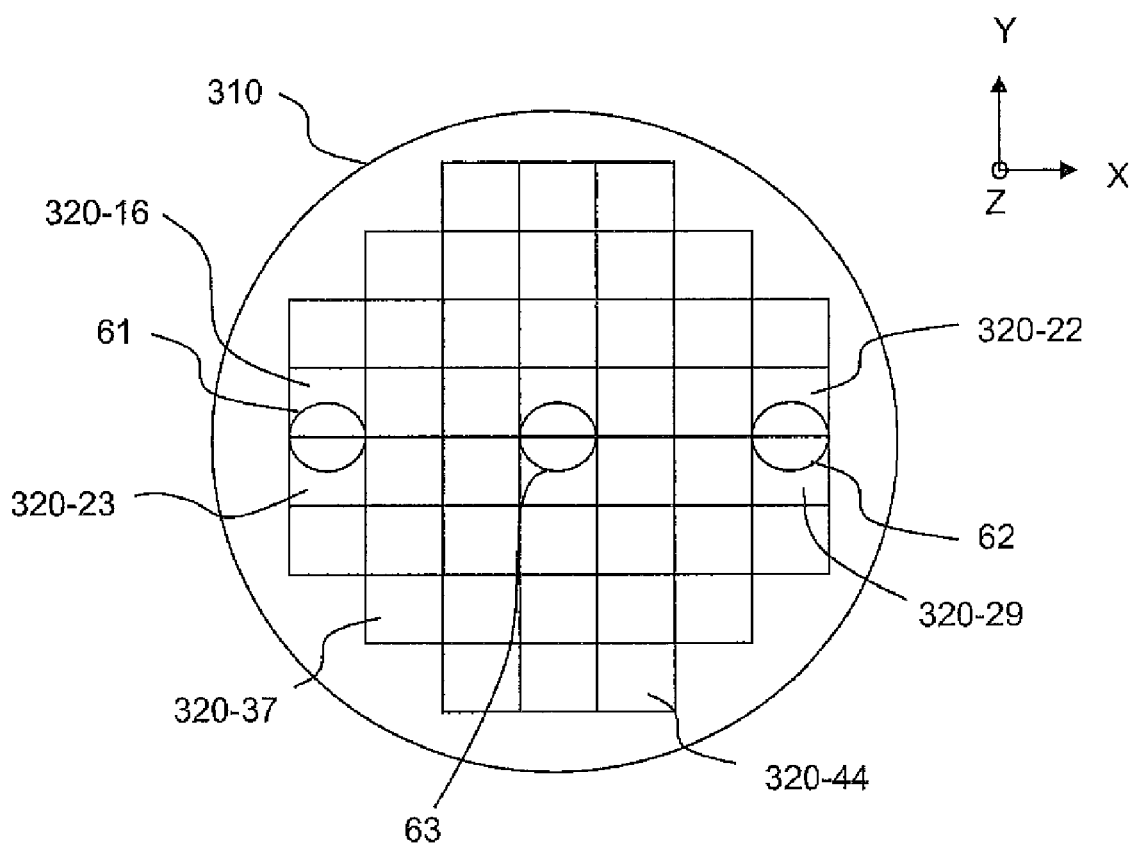
FIG. 10 depicts areas on the optical phase adjuster which are, in use, traversed by diffracted beams.

In FIG. 10, areas 61, 62 and 63 on the optical phase adjuster 110 and traversed by the diffracted beams 211, 212, and 213 respectively, are shown. Portions 320 which are at least partially covered by the areas can be activated such as to provide the desired phase change, as mentioned above. For example, a temperature of portions 320-16 and 320-23 as well as of portions 320-22 and 320-29 may be controlled to yield a phase adjustment of 33.54° which, as explained above, is desired for the first-order diffracted beam 211 and 212, respectively. Similarly, a temperature of portions 320 not explicitly numbered in FIG. 10, and covered by area 63, may be controlled to yield a phase adjustment of −20.12° which, as explained above, is desired for the zeroth order diffracted beam 213.

Figure 11:
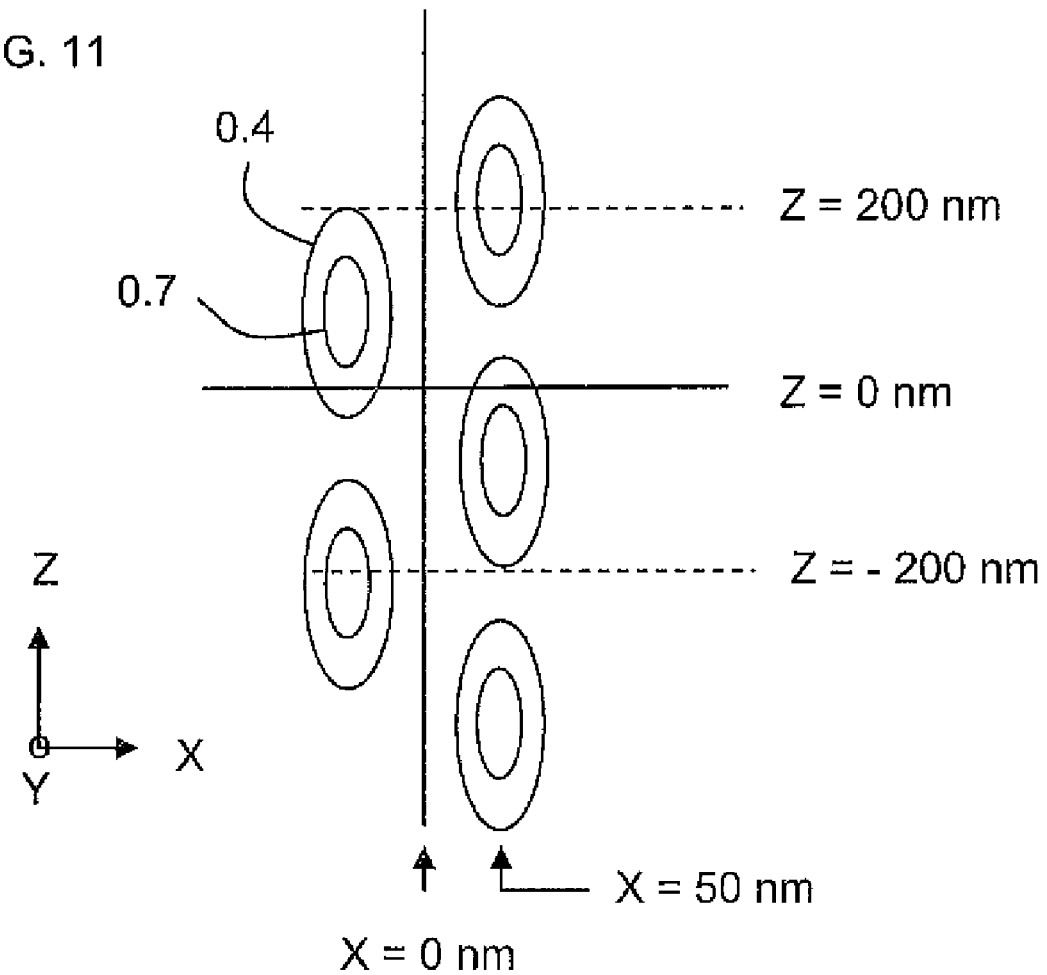
FIG. 11 depicts an intensity distribution in an X,Z plane near the substrate.

A resulting intensity distribution in the X,Z-plane near the substrate is schematically shown in FIG. 11. Contour lines show relative intensities of 0.4 and 0.7 in arbitrary units. The level Z=0 nm represents the level of best focus. At best focus, the intensity imbalance is reduced, so that in principle a use of additional topographic features to alleviate intensity imbalance may not be needed.

In the presence of a defocus, however, and as illustrated in FIG. 11, there may still be an intensity imbalance beyond tolerance. This is due to the presence of the zeroth order diffracted beam 213 in the focal area where image formation is occurring. The zeroth order beam causes a strong intensity modulation along the Z direction, whereas in the absence of the zeroth order beam (e.g. in the thin mask approximation) such a modulation is absent.

To further enhance or increase a useful Depth of Focus (referred to as DoF, hereinafter), within which intensity imbalance remains within tolerance, an embodiment of the invention includes identifying diffracted beams where an electric amplitude of an optical field has to be reduced. For example, reducing the electric amplitude of the zeroth order diffracted beam 213 in the above embodiment will provide a further increase of DoF. A footprint at the phase adjuster of a diffracted beam of which the amplitude is to be reduced, is divided into two non-overlapping sub areas, a size of the areas chosen such that the sub areas are traversed, in use, by portions of the diffracted beam of substantially equal intensity. A reduction of electric field amplitude, at the image of the mask pattern, of the diffracted beam is obtained by applying a phase difference of 180° to an interference between the zeroth and plus first-order diffracted beams and between the zeroth and minus first-order diffracted beams in the two sub areas of the phase adjuster.

Figure 12:
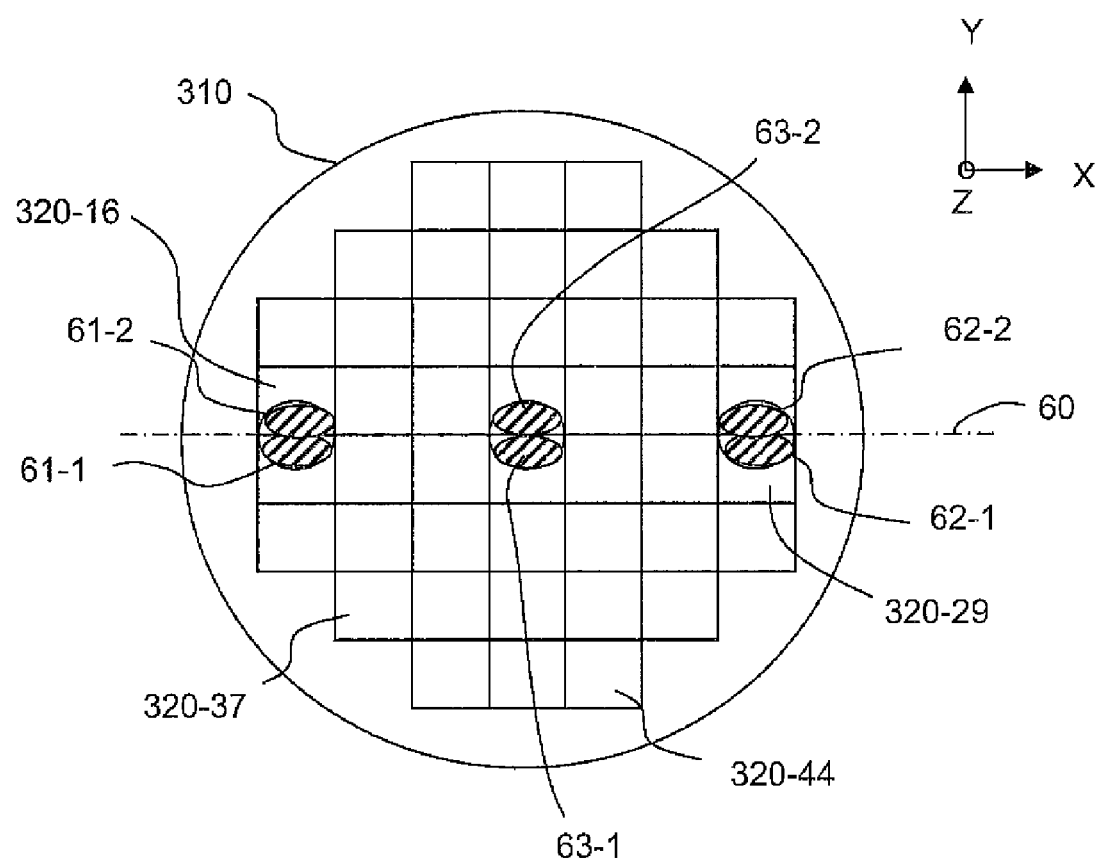
FIG. 12 depicts a division into sub areas of areas of the optical phase adjuster which are, in use, traversed by portions of diffracted beams.

In the embodiment, the division into sub areas is applied along an axis 60 connecting areas 61 and 62 traversed in use by the plus and minus first-order diffracted beams 211 and 212, as illustrated in FIG. 12. The connecting axis 60 defines sub-areas 63-1 and 63-2 of the area 63 traversed by the zeroth order diffracted beam. Similarly, the axis 60 defines sub-areas 61-1 and 61-2 of the area 61 traversed by the plus first-order diffracted beam 211 and sub-areas 62-1 and 62-2 of the area 62 traversed by the minus first-order diffracted beam 212. By applying a phase adjustment of dΦ31=−20.12°–90° to area 63-1 and a phase adjustment dΦ32=−20.12°–90° to area 63-2 the negative effect of the zeroth order beam 213 on DoF is mitigated. According to an aspect of the embodiment, the phase adjustments {dΦ1, dΦ2, dΦ3}={33.54°, 33.54°, −20.12°} are modified such that only the phase adjustment {dΦ31}, associated with the portions 61-1, 62-1 and 63-1 of the phase adjuster, is raised by 90°, whereas the phase adjustment {dΦ32}, associated with the portions 61-2, 62-2 and 63-2 of the phase adjuster, is lowered by 90°. It is appreciated that only interference terms associated with an interference between the zeroth and plus first-order diffracted beams and between the zeroth and minus first-order diffracted beams have to shift +90° in a first portion of the incoherent radiation traversing the phase adjuster at one side of the connecting axis 60, and −90° in a second portion of the incoherent radiation traversing the phase adjuster at the other side of the connecting axis 60, so as to diphase the effects of the zeroth order diffracted beam. Any interferences between the first-order diffracted beams have to stay intact and must not be shifted relatively with respect to each other in the aforementioned first and second portions of the radiation. As a result, desired phase adjustments to be applied to the phase adjuster are, in the present embodiment:

$$\{d\Phi 11, d\Phi 21, d\Phi 31\} = \{33.54°, 33.54°, 69.88°\},$$

and $$\{d\Phi 12, d\Phi 22, d\Phi 32\} = \{33.54°, 33.54°, -110.12°\}.$$

Without affecting imaging properties, each one of the set of phases adjustments {dΦ11, dΦ21, dΦ31} and {dΦ12, dΦ22, dΦ32} can be recalibrated by adding a constant phase portion to the phase adjustments. The additional phase portion may be chosen such that with respect to zero phase adjustment the actual desired phase adjustments are minimal in absolute sense. Hence, a phase portion of −51.71° may be added to {dΦ11, dΦ21, dΦ31}={33.54°, 33.54°, 69.88°}, to obtain an alternative set of phase adjustments {dΦ11, dΦ21, dΦ31}={−18.17°, −18.17°, 18.17°}, thereby minimizing any absolute phase adjustment that is to be provided by temperature controlling the areas 61-1, 62-1 and 63-1 of the phase adjuster.

Similarly, a phase portion of +38.29° may be added to {dΦ12, dΦ22, dΦ32}={33.54', 33.54°, −110.12°} to obtain an alternative set of phase adjustments {dΦ12, dΦ22, dΦ32}={71.83°, 71.83°, −71.83°}.

Now the plus first and minus first-order diffracted beams still have 180° phase difference, but also the interferences of the zeroth and plus first-order diffracted beams and the zeroth and minus first-order diffracted beams have now opposite effects for the first and second portions of radiation at either side of the connecting line 60.

The intensity modulation along the Z direction, as schematically shown in FIG. 11, is now reduced such that over a defocus of plus or minus 100 nm substantially no intensity imbalance is present. It is appreciated that there is a reduction in contrast, since the intensity of the zeroth order diffracted beam has been redistributed as background intensity. However, there is provided an improved contrast over the contrast obtained with, for example a binary mask or with an altPSM in the absence of any phase adjustments.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A device manufacturing method of projecting a mask pattern of an alternating phase shift mask onto a substrate, the method comprising:
    illuminating the mask pattern with a beam of radiation to provide a zeroth order diffracted radiation, first first-order diffracted radiation and second first-order diffracted radiation emanating from the mask pattern;
    imaging the mask pattern onto a substrate using a projection system; and
    adjusting phase using an optical phase adjuster, wherein the zeroth and first-order diffracted radiation traverses the optical phase adjuster, the adjusting including:
    adjusting a phase of the zeroth order diffracted radiation to substantially match a phase of the first first-order diffracted radiation, or vice versa, using the phase adjuster, and
    adjusting a phase of the second first-order diffracted radiation to substantially match the phase of the first first-order diffracted radiation plus 180° using the phase adjuster.

2. The method of claim 1, further comprising:
    applying a phase difference of 180° to two sub areas of the phase adjuster, a footprint at the optical phase adjuster of a diffracted beam for which a reduction of an electric amplitude of an optical field will improve depth of focus, comprising the two sub areas and a size of the sub areas arranged such that the sub areas are traversed, in use, by portions of the diffracted beam of substantially equal intensity.

3. The method of claim 2, wherein the diffracted beam for which the reduction of the electric amplitude of the optical field will improve depth of focus is the zeroth order diffracted beam.

4. The method of claim 2, wherein the two sub areas are divided along an axis connecting areas traversed in use by the first and second first-order diffracted beams.

5. The method of claim 4, wherein the connecting axis defines sub-areas of the area traversed by the zeroth order diffracted beam, sub-areas of the area traversed by the first first-order diffracted beam and sub-areas of the area traversed by the second first-order diffracted beam.

6. The method of claim 3, further comprising:
applying a phase adjustment of +90° to one of the sub areas traversed by a portion of the zeroth order diffracted beam; and
applying a phase adjustment of −90° to an other one of the sub areas traversed by a portion of the zeroth order diffracted beam.

7. A lithographic apparatus including a phase adjuster constructed and arranged to adjust a phase of an electric field of an optical radiation beam traversing a projection system of the lithographic apparatus, and a controller constructed and arranged to apply a spatial phase distribution to an optical wave traversing the phase adjuster, the controller including a computer program containing machine-readable instructions arranged to
adjust a phase of zeroth order diffracted radiation to substantially match a phase of first first-order diffracted radiation, or vice versa, using the phase adjuster, and
adjust a phase of second first-order diffracted radiation to substantially match the phase of the first first-order diffracted radiation plus 180° using the phase adjuster, wherein
a mask pattern is illuminated with a beam of radiation to provide the zeroth order diffracted radiation, the first first-order diffracted radiation and the second first-order diffracted radiation emanating from the mask pattern and the zeroth and first-order diffracted radiation traverse the optical phase adjuster, and
the mask pattern is imaged on a substrate using the projection system.

8. The apparatus of claim 7, wherein the computer program containing machine-readable instructions are arranged to apply a phase difference of 180° to two sub areas of the phase adjuster, a footprint at the optical phase adjuster of a diffracted beam for which a reduction of an electric amplitude of an optical field will improve depth of focus, comprising the two sub areas and a size of the sub areas arranged such that the sub areas are traversed, in use, by portions of the diffracted beam of substantially equal intensity.

9. The apparatus of claim 8, wherein the diffracted beam for which the reduction of the electric amplitude of the optical field will improve depth of focus is the zeroth order diffracted beam.

10. The apparatus of claim 8, wherein the two sub areas are divided along an axis connecting areas traversed in use by the first and second first-order diffracted beams.

11. The apparatus of claim 10, wherein the connecting axis defines sub-areas of the area traversed by the zeroth order diffracted beam, sub-areas of the area traversed by the first first-order diffracted beam and sub-areas of the area traversed by the second first-order diffracted beam.

12. The apparatus of claim 9, wherein the computer program containing machine-readable instructions are arranged to:
apply a phase adjustment of +90° to one of the sub areas traversed by a portion of the zeroth order diffracted beam; and
apply a phase adjustment of −90° to an other one of the sub areas traversed by a portion of the zeroth order diffracted beam.

13. A device manufacturing method of projecting a pattern of a patterning device onto a substrate, the method comprising:
emanating a zeroth order diffracted radiation, first first-order diffracted radiation and second first-order diffracted radiation from the pattern of the patterning device;
imaging the pattern onto a substrate using a projection system; and
adjusting phase of at least part of the diffracted radiation using an optical phase adjuster, wherein the zeroth and first-order diffracted radiation traverses the optical phase adjuster, the adjusting including:
adjusting phase so that the phase of the zeroth order diffracted radiation substantially matches the phase of the first first-order diffracted radiation, and
adjusting phase so that the phase of the second first-order diffracted radiation substantially matches the phase of the first first-order diffracted radiation plus 180°.

14. The method of claim 13, further comprising:
applying a phase difference of 180° to two sub areas of the phase adjuster, a footprint at the optical phase adjuster of a diffracted beam for which a reduction of an electric amplitude of an optical field will improve depth of focus, comprising the two sub areas and a size of the sub areas arranged such that the sub areas are traversed, in use, by portions of the diffracted beam of substantially equal intensity.

15. The method of claim 14, wherein the diffracted beam for which the reduction of the electric amplitude of the optical field will improve depth of focus is the zeroth order diffracted beam.

16. The method of claim 14, wherein the two sub areas are divided along an axis connecting areas traversed in use by the first and second first-order diffracted beams.

17. The method of claim 16, wherein the connecting axis defines sub-areas of the area traversed by the zeroth order diffracted beam, sub-areas of the area traversed by the first first-order diffracted beam and sub-areas of the area traversed by the second first-order diffracted beam.

18. The method of claim 15, further comprising:
applying a phase adjustment of +90° to one of the sub areas traversed by a portion of the zeroth order diffracted beam; and
applying a phase adjustment of −90° to an other one of the sub areas traversed by a portion of the zeroth order diffracted beam.

* * * * *